(12) United States Patent
Gopalan et al.

(10) Patent No.: US 9,123,784 B2
(45) Date of Patent: Sep. 1, 2015

(54) MEMORY PROCESS AND MEMORY STRUCTURE MADE THEREBY

(75) Inventors: Vivek Gopalan, Boise, ID (US); Robert Kerr, Boise, ID (US); Hung-Ming Tsai, Kaohsiung (TW)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 315 days.

(21) Appl. No.: 13/590,204

(22) Filed: Aug. 21, 2012

(65) Prior Publication Data

US 2014/0054794 A1 Feb. 27, 2014

(51) Int. Cl.
*H01L 27/108* (2006.01)
*H01L 21/768* (2006.01)

(52) U.S. Cl.
CPC .... *H01L 21/76883* (2013.01); *H01L 21/76802* (2013.01); *H01L 27/108* (2013.01); *H01L 27/10891* (2013.01)

(58) Field of Classification Search
CPC ..................................................... H01L 27/108
USPC .................................................. 257/E27.084
See application file for complete search history.

(56) References Cited

U.S. PATENT DOCUMENTS

2002/0182859 A1* 12/2002 Farrar ............................ 438/652
2007/0152257 A1* 7/2007 Park et al. ...................... 257/308
2008/0135907 A1 6/2008 Lin et al.
2009/0057778 A1 3/2009 Dreeskornfeld et al.
2010/0001249 A1* 1/2010 Uchiyama ......................... 257/2
2010/0013047 A1 1/2010 Thies et al.
2011/0237047 A1* 9/2011 Jang et al. ..................... 438/430
2012/0009772 A1 1/2012 Mathew et al.
2012/0061742 A1 3/2012 Maekawa

FOREIGN PATENT DOCUMENTS

JP 2001196477 7/2001

OTHER PUBLICATIONS

"Office Action of Taiwan Counterpart Application," issued on Dec. 25, 2014, p. 1-p. 5.

* cited by examiner

*Primary Examiner* — Mohammad Choudhry
(74) *Attorney, Agent, or Firm* — Jianq Chyun IP Office

(57) ABSTRACT

A memory process is described. A substrate is provided, having therein trenches and conductive lines buried in the trenches and having thereon an array area, wherein each of the conductive lines has an array portion in the array area. A contact area apart from the array area is defined on the substrate, wherein each of the conductive lines has a contact portion in the contact area. The substrate between the contact portions of the conductive lines is etched down to below the tops of the conductive layers to form gaps between the contact portions of the conductive lines. The gaps are then filled with an insulating layer.

8 Claims, 2 Drawing Sheets

MEMORY PROCESS AND MEMORY STRUCTURE MADE THEREBY

BACKGROUND OF THE INVENTION

1. Field of Invention

This invention relates to a memory process and a memory structure made thereby, and particularly relates to a memory process that inhibits bending of buried conductive lines, and a memory structure fabricated with the memory process.

2. Description of Related Art

For purposes of increasing the channel length of transistors, fully utilizing the space of the substrate, increasing the distance between different levels of conductive lines and so forth, it is feasible to form buried conductive lines in the substrate.

For example, when the integration degree of DRAM increases beyond a certain level, the channel length of a traditional planar transistor is reduced to cause the short channel effects and so forth, and the shrinking of the device size also reduces the distance between word lines and bit lines to induce parasitic capacitance. By forming the word lines as buried lines in the substrate, the above issues are solved.

The buried word lines are electrically connected to conductive plugs by their end portions in a contact area. In a conventional process of forming buried word lines, the substrate material in an area is etched to form a cavity and define a contact area, the cavity is filled by a spin-on dielectric (SOD) film, a plurality of trenches are formed in the substrate in the array area and in the SOD film filled in the contact area by etching, a wet clean treatment is conducted, a gate oxide film is formed in each of the trenches, and then buried word lines are formed in the trenches.

Because the portions of the buried word lines in the contact area are anchored in a SOD film and the CD deviation of the trenches for containing the buried word lines caused by the wet clean treatment is large in the SOD film, the buried word lines show worse line bending in the contact area.

SUMMARY OF THE INVENTION

Accordingly, this invention provides a memory process that is capable of solving the above-mentioned problems in the prior art.

This invention also provides a memory structure that is fabricated through the memory process of this invention.

The memory process of this invention is described as follows. A substrate is provided, having therein a plurality of trenches and a plurality of conductive lines in the trenches and having thereon an array area, wherein each of the conductive lines has an array portion in the array area. A contact area apart from the array area is defined on the substrate, wherein each conductive line has a contact portion in the contact area. The substrate between the contact portions of the conductive lines is etched down to below the tops of the conductive layers to form gaps between the contact portions of the conductive lines. The gaps are then filled with an insulating layer.

In an embodiment, the above memory process further includes: forming, on the contact portion of each conductive line, at least one contact plug.

In an embodiment, the above memory process further includes: forming a substantially conformal protective layer covering the contact portions of the conductive layers after the substrate is etched but before the gaps are filled.

The memory structure of this invention includes a substrate, a plurality of conductive lines and an insulating layer. The substrate has therein a plurality of trenches and has thereon an array area and a contact area apart from the array area, wherein the surface of the substrate is lower in the contact area than outside of the contact area. Each of the conductive lines fills in a trench and has an array portion in the array area and a contact portion in the contact area, wherein the contact portion is protruding above the lower surface of the substrate in the contact area. The insulating layer fills in the gaps between the protruding parts of the contact portions of the conductive lines in the contact area.

In an embodiment, the above memory structure further includes, on the contact portion of each conductive line, at least one contact plug.

In an embodiment, the above memory structure further includes a substantially conformal protective layer covering the contact portions of the conductive lines.

In this invention, because the contact area is defined after the buried conductive lines are formed in the substrate and the CD deviation of the trenches of the buried lines caused by the wet clean treatment is less for the substrate material as compared to SOD, bending of the buried conductive lines can be inhibited.

Moreover, because the cap layer of the buried conductive lines in the contact area can be etched separately without impacting the cap layer in the array area, it is possible to cap the buried conductive lines with a protective layer such as a nitride layer. The nitride layer can be removed in the step of filling the gaps between the contact portions of the conductive lines with an insulating layer to facilitate the etching for forming the contact holes for the contacts of the buried conductive lines.

In order to make the aforementioned and other objects, features and advantages of this invention comprehensible, a preferred embodiment accompanied with figures is described in detail below.

BRIEF DESCRIPTION OF THE DRAWINGS

FIG. 1A illustrates a top view of the structure in the step illustrated by FIG. 1, wherein FIG. 1 is a cross-sectional view along the line A-A or the line B-B.

FIG. 2A illustrates a top view of the structure in the step illustrated by FIG. 2, wherein FIG. 2 is a cross-sectional view along the line A-A.

DESCRIPTION OF EMBODIMENTS

This invention is further explained with the following embodiments referring to the accompanying drawings, which are not intended to limit the scope of this invention.

Figure 1A:
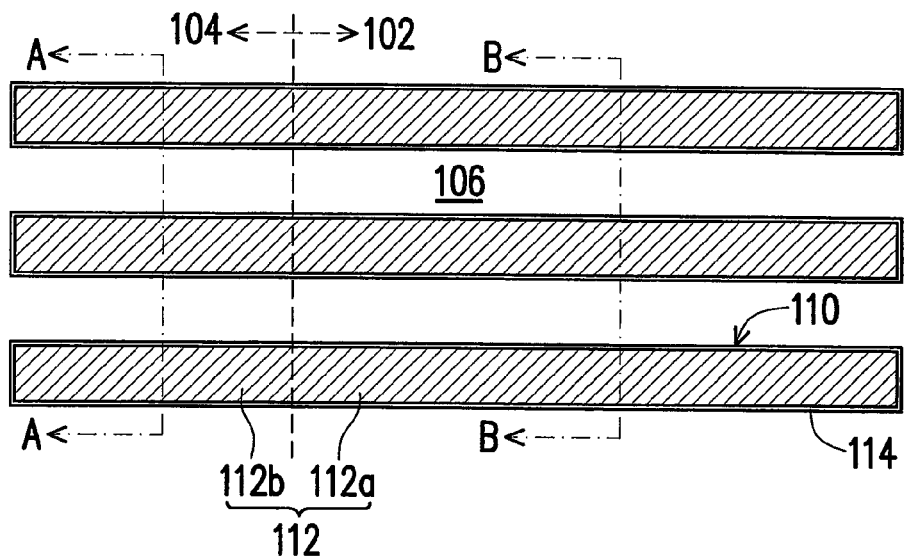
Figures 1, 2:
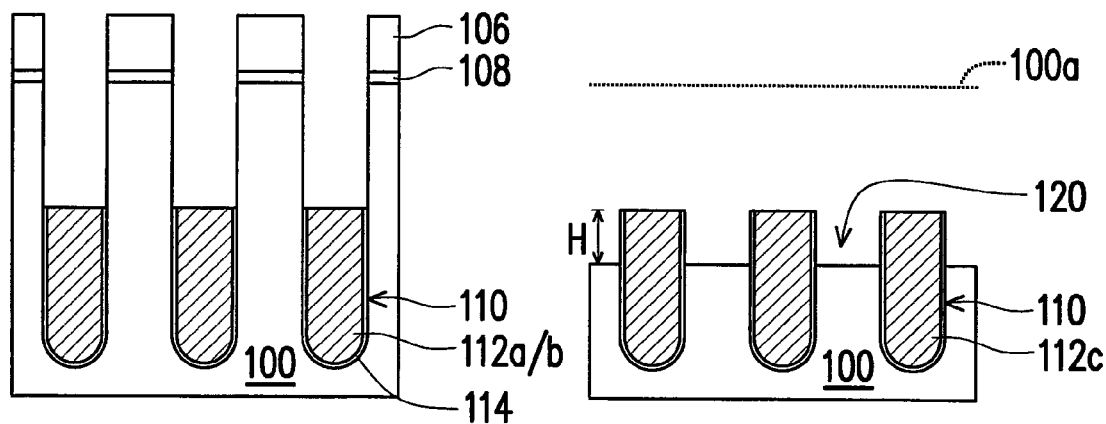
FIGS. 1-4 illustrate, in a cross-sectional view, a memory process according to an embodiment of this invention, wherein FIG. 4 also illustrates a cross-sectional view of a memory structure according to the embodiment of this invention.
Figure 2A:
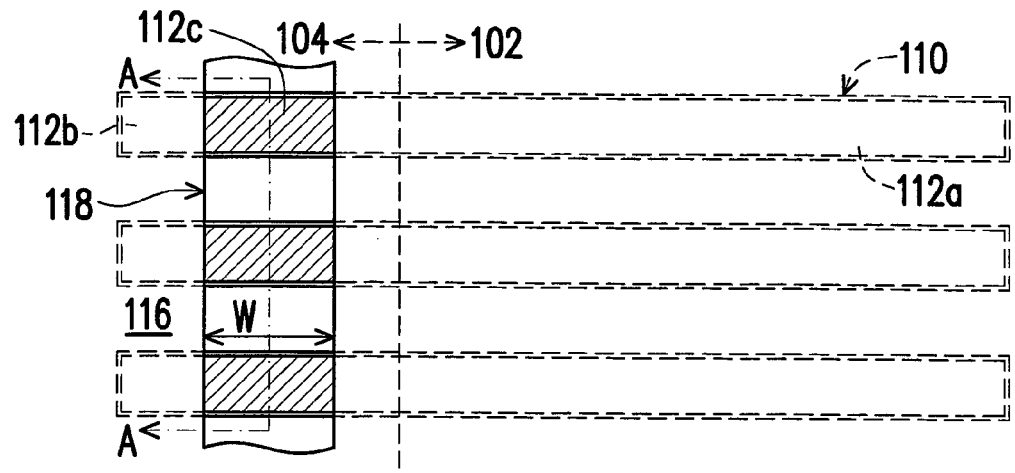

FIGS. 1-4 illustrate, in a cross-sectional view, a memory process according to an embodiment of this invention. FIG. 1A illustrates a top view of the structure in the step illustrated by FIG. 1, wherein FIG. 1 is a cross-sectional view along the line A-A or the line B-B. FIG. 2A illustrates a top view of the structure in the step illustrated by FIG. 2, wherein FIG. 2 is a cross-sectional view along the line A-A.

Referring to FIGS. 1 and 1A, a substrate 100 is provided, which has thereon an array area 102 and a non-array area 104, has thereon a patterned mask layer 106, and has therein a plurality of trenches 110 defined by the patterned mask layer 106 and a plurality of conductive lines 112 buried in the trenches 110. The substrate 100 may be a silicon substrate.

The mask layer 106 may include silicon nitride (SiN), and may be formed after a pad oxide layer 108 is formed on the substrate 100. Each of the conductive lines 112 may be separated from the substrate 100 around the trenches 110 by a thin insulating layer 114, which may include silicon oxide. The buried conductive lines 112 may be the word lines of a dynamic random access memory (DRAM).

Each conductive line 112 includes an array portion 112a in the array area 102 and a non-array portion 112b in the non-array area 104, wherein the non-array portion 112b is contiguous with the array portion 112a. The top surface of each conductive line 112 is usually lower than that of the substrate 100, possibly by 60-65 nm. The conductive lines 112 may include a metallic material, such as TiN or TiN/W.

Referring to FIGS. 2 and 2A, a contact area 118 apart from the array area 102 is defined in the non-array area 104 on the substrate 100, wherein each conductive line 112 has a contact portion 112c in the contact area 118. The contact area 118 may be defined by a patterned photoresist layer 116 that has therein a corresponding opening exposing the contact area 118. The width W of the contact area 118, or the dimension of the contact area 118 in the extending direction of the buried conductive lines 112, may range from 500 nm to 550 nm.

Thereafter, with the patterned photoresist layer 116 as a mask, the substrate 100 between the contact portions 112c of the conductive lines 112 is etching down to below the tops of the conductive layers 112 to form a plurality of gaps 120 between the contact portions 112c of the conductive lines 112 (FIG. 2). The height difference H between the top of the etched substrate 100 and the tops of the contact portions 112c of the conductive lines 112 may range from 7.5 nm to 10 nm. It is also noted that the original surface level of the substrate 100 is indicated by the dot line 100a.

Figure 3:
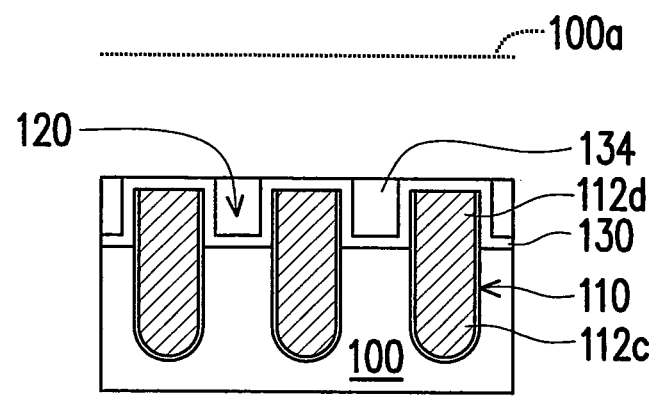

Referring to FIG. 3, a substantially conformal protective layer 130, such as a SiN layer, is formed covering the tops and the sidewalls of the protruding parts 112d of the contact portions 112c of the conductive lines 112. The gaps 120 between the contact portions 112c of the conductive lines 112 are then filled with an insulating layer 134. The insulating layer 134 may include a spin-on dielectric (SOD) layer, which may be formed by steps including: coating a SOD material over the substrate 100, densifying the coated SOD material, and then removing the densified SOD outside of the gaps 120 by chemical mechanical polishing (CMP). The SOD material may be polysilazane.

Moreover, it is possible to continue the CMP process to remove the protective layer 130 on the tops of the protruding parts 112d of the contact portions 112c of the buried conductive lines 112 after the densified SOD material outside of the gaps 120 is removed, so as to facilitate the subsequent contact-hole forming process.

Figure 4:
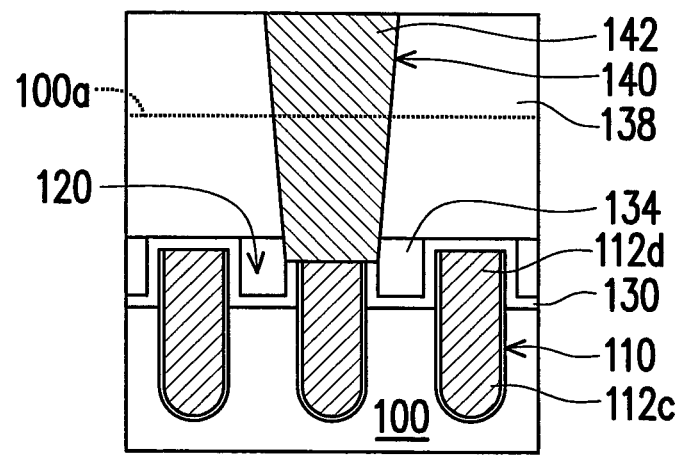

Referring to FIG. 4, a dielectric layer 138 is formed on the resulting structure, typically with a top surface higher than the original surface level 100a of the substrate 100. Thereafter, on the contact portion 112c of each buried conductive line 112, at least one contact hole 140 is formed in the dielectric layer 138 through anisotropic etching. It is particularly noted that FIG. 4 only shows one contact hole 140 above the contact portion 112c of only one buried conductive line 112, because the contact holes of the other conductive lines 112 shown in the figure cannot be seen in the same cross-sectional view. A contact plug 142 is then formed in each contact hole 140 formed in the dielectric layer 138.

FIG. 4 also illustrates a cross-sectional view of a memory structure according to the embodiment of this invention, while the top view of the memory structure may be referred to with FIG. 2A.

Referring to FIGS. 2A and 4, the memory structure includes a substrate 100, a plurality of conductive lines 112, a protective layer 130, an insulating layer 134, a dielectric layer 138 and a plurality of contact plugs 142.

The substrate 100 has therein a plurality of trenches 110 and has thereon an array area 102 and a contact area 118 apart from the array area 102, wherein the surface of the substrate 100 is lower in the contact area 102 than outside of the contact area. Each of the conductive lines 112 fills in a trench 110 and has an array portion 112a in the array area 102 and a contact portion 112c in the contact area 118, wherein the contact portion 112c is protruding above the lower surface of the substrate 100 in the contact area 118.

The protective layer 130 covers the protruding parts 112d of the contact portions 112c of the conductive lines 112 in a substantially conformal manner. The insulating layer 134 fills in the gaps 120 between the protruding parts 112d of the contact portions 112c of the conductive lines 112 in the contact area 102. The dielectric layer 138 covers the above structure. The contact plugs 142 are disposed in the dielectric layer 138 and through the protective layer 130 to contact the contact portions 112c of the conductive lines 112, wherein on each contact portion 112c, one or more contact plugs 142 can be formed depending on the requirements of electrical properties. The possible materials of the above parts of the memory structure have been mentioned as above and are not repeated here.

Because the contact area is defined after the buried conductive lines are formed in the substrate and the CD deviation of the trenches of the buried lines caused by the wet clean treatment is less for the substrate material as compared to SOD, bending of the buried conductive lines can be inhibited.

Moreover, because the cap layer of the buried conductive lines in the contact area can be etched separately without impacting the cap layer in the array area, it is possible to cap the buried conductive lines with a protective layer such as a nitride layer. The nitride layer can be removed in the step of filling the gaps between the contact portions of the conductive lines with an insulating layer to facilitate the etching for forming the contact holes for the contacts of the buried conductive lines.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A memory structure, comprising:
   a substrate, having therein a plurality of trenches, and having thereon an array area and a contact area apart from the array area, wherein each trench has a first portion in the contact area and a second portion in the array area, and the substrate between the first portions of the trenches is also in the contact area and has a surface lower than a surface of the substrate between the trenches outside of the contact area;
   a plurality of conductive lines, each buried in a trench and having an array portion in the array area and a contact portion in the contact area, wherein the contact portion is protruding above the lower surface of the substrate between the first portions of the trenches in the contact area; and
   an insulating layer, filling in gaps between protruding parts of the contact portions of the conductive lines in the contact area.

2. The memory structure of claim 1, further comprising, on the contact portion of each of the conductive lines, at least one contact plug.

3. The memory structure of claim 1, further comprising a substantially conformal protective layer covering the contact portions of the conductive lines.

4. The memory structure of claim 3, further comprising, on the contact portion of each of the conductive lines and through the protective layer, at least one contact plug.

5. The memory structure of claim 1, wherein the insulating layer comprises a spin-on dielectric (SOD) layer.

6. The memory structure of claim 1, wherein the conductive lines are word lines of a DRAM.

7. The memory structure of claim 1, wherein a width of the contact area ranges from 500 nm to 550 nm.

8. The memory structure of claim 1, wherein in the contact area, the surface of the substrate is lower than the tops of the contact portions of the conductive lines by 7.5-10 nm.

\* \* \* \* \*